United States Patent [19]
Largent

[11] Patent Number: 5,371,757
[45] Date of Patent: Dec. 6, 1994

[54] INTEGRATED SEMICONDUCTOR LASER OSCILLATOR AND OFF-AXIS AMPLIFIER

[75] Inventor: Craig C. Largent, Gainsville, Fla.

[73] Assignee: The United States of America as represented by the Secretary of the Air Force, Washington, D.C.

[21] Appl. No.: 147,240

[22] Filed: Oct. 22, 1993

[51] Int. Cl.⁵ ........................ H01S 3/19; H01L 15/00
[52] U.S. Cl. ........................................ 372/50; 372/20; 372/45; 372/99; 359/344
[58] Field of Search .................. 372/50, 45, 92, 20, 372/99; 359/333, 344

[56] References Cited

U.S. PATENT DOCUMENTS

| | | | |
|---|---|---|---|
| 4,774,473 | 9/1988 | Johnson et al. | 330/4.3 |
| 4,920,542 | 4/1990 | Brosson et al. | 372/50 |
| 5,175,818 | 9/1992 | Thijs et al. | 359/344 |
| 5,184,247 | 2/1993 | Schimpe | 359/344 |
| 5,309,469 | 5/1994 | Koren et al. | 372/50 |

*Primary Examiner*—Georgia Y. Epps
*Attorney, Agent, or Firm*—Robert L. Nathans; Stanton E. Collier

[57] ABSTRACT

A semiconductor master oscillator generates light which seeds a pair of semiconductor power amplifiers which straddle the oscillator. The power amplifiers have slightly misaligned mirror facets which induce substantial resonator losses in the amplifiers and as a result, the amplifier gain is very high and the modulating speed of the oscillator is also very high.

26 Claims, 1 Drawing Sheet

INTEGRATED SEMICONDUCTOR LASER OSCILLATOR AND OFF-AXIS AMPLIFIER

BACKGROUND OF THE INVENTION

The present invention relates to the field of solid state coherent light beam generating devices.

Historically, producing high speed and high power devices has required very different design rules. High speed semiconductor lasers are characterized by low threshold, low current drive levels and low resistance and capacitance. On the other hand, lasers that produce high power output are, by necessity, driven by high currents, exhibit high thresholds, and are difficult to modulate at high rates. As a result of these conflicting physical requirements, devices that produce both high speed modulation rates and high power have not become commonplace in the field.

BRIEF SUMMARY OF AN EMBODIMENT OF THE INVENTION

It is thus an object of the present invention to provide a solid state monolithic coherent light beam generator that provides both high switching rates and high power.

In accordance with the invention, a broad area off-axis amplifier or amplifiers, comprising amplifier means, amplifies the light produced by a master oscillator while still maintaining good beam quality. When the master oscillator is off, the amplifier will produce amplified spontaneous emission (ASE) with extremely poor beam quality and brightness. This ASE will result from the continuous bias current of several amps continuously supplied to the amplifier. When the oscillator lases, the amplifier will coherently amplify the light seeded from the oscillator, thereby increasing beam quality dramatically. The modulation rate will not be limited by the large amplifying currents, but by the small currents used to drive the oscillator, and thus high modulation rates are available, regardless of the high amplifying currents. A single, monolithic, compact, low weight and reliable device is thus provided, capable of having high modulation rates and high output light beam power. A separate electrical contact arrangement for the central oscillator and the off-axis amplifiers is employed to attain these beneficial results. A feature of the invention is to provide front amplifier mirror facets which are slightly nonparallel with respect to the opposite rear mirror facet for producing high gain in the amplifier.

BRIEF DESCRIPTION OF THE DRAWINGS

Various features and advantages of the invention will become more apparent upon study of the following description, taken in conjunction with the drawings in which.

DETAILED DESCRIPTION OF PREFERRED EMBODIMENTS OF THE INVENTION

The laser diode light beam generator consists of a body 3 of a single crystalline semiconductor material. Lasers of this type can be fabricated using III-V or II-VI compounds or alloys of these compounds. The body 3 has a flat back or rear facet 4 formed by cleavage along a crystal plane. Likewise with respect to the front facet 5 except that the front facet is uniquely fabricated to have a concave surface.

Figure 1:
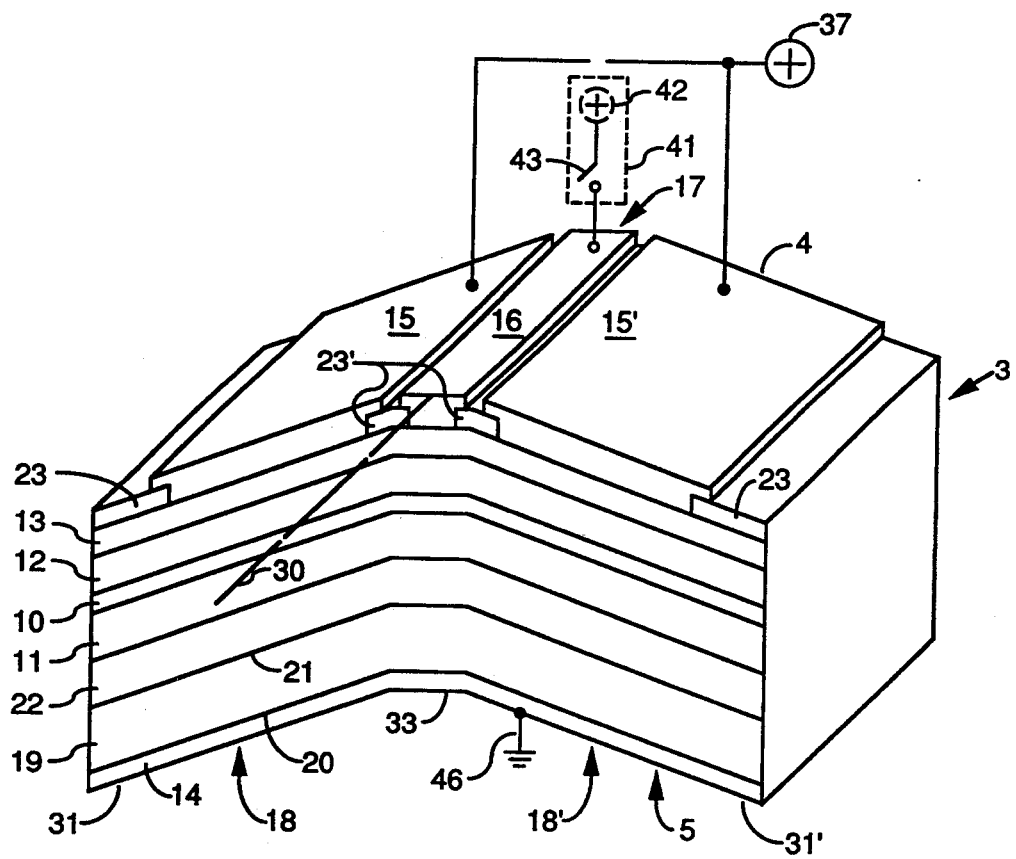
FIG. 1 illustrates a preferred embodiment of the device in perspective.
Figure 2:
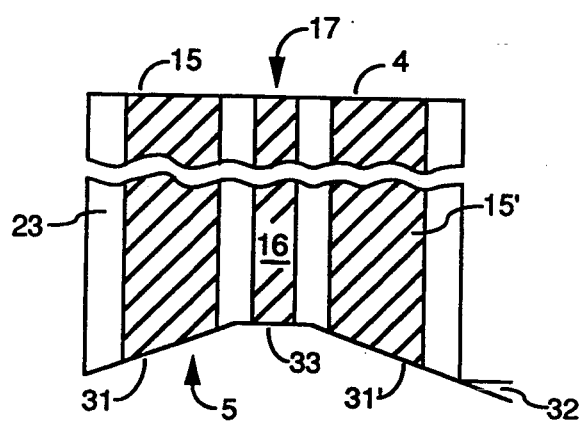
FIG. 2 illustrates a top view of the device.

As shown in FIG. 1, the body 3 consists of a substrate 19 of one conductivity type, e.g. N-type GaAs, with parallel top and bottom surfaces 20 and 21. On this substrate, epitaxial layers are grown that comprise an N-type buffer layer 22, an N-type cladding layer 11, an active region 10, typically a single quantum well structure, a P-type cladding layer 12, and a highly doped P-type cap layer 13. An insulating layer of Si N, SiO or a like compound 23 is deposited on top of the P-cap layer 13. This insulating layer is patterned using photolithography, resulting in the removal of the insulating compound in areas where current injection will occur. A metal contact 14, typically a Ni, Au/Ge, Au alloy is deposited on the bottom of N-type substrate 19. Additionally, patterned metal contacts 15, 15' and 16, typically a Ti, Pt, and Au alloy, are deposited on the top surface of the laser, adhering to the remaining insulating layers 23 and 23' that were not removed, and exposed areas of the p-cap layer 13. For a background discussion of various laser diode geometries, including the aforesaid layers, reference may be made to "Semiconductor Lasers and Hetrojunction LEDs", Academic Press, 1977, New York, pages 137-141.

Lower electrode 14, upper electrode 16 and the layers therebetween comprise the elongated high speed master oscillator 17 extending along oscillator axis 30, whereas the broad area wings 18 and 18' comprise the aforesaid off-axis amplifiers positioned alongside the oscillator and are characterized by an angle 32 between the tilted front facets 31 and 31' and the rear facet 4. This angle can be typically between one and three degrees. In contrast, the central front facet 33 of the oscillator is parallel with respect to the rear facet 4.

The lower electrode 14, positioned under all of the structure shown, is grounded at 46. A high continuous current amplifier bias source 37 is connected to upper amplifier electrodes 15 and 15'. Upper oscillator electrode 16 can be connected to a low current control device 41 which can include a low current source 42 coupled to electrode 16 via a current control means 43. Control means 43 could comprise a switch or modulator for controlling the beam, e.g. to turn the device on or off or to modulate the beam for data transmission. Thus the device provides separate electrically isolated contacts for the high speed oscillator and the power amplifiers, permitting high speed modulation of the oscillator and large power outputs from the off-axis amplifiers simultaneously.

Laser action is controlled by the current flow through the oscillator 17, and in this way, the amplifiers will become slaved to the oscillator as they receive light produced by the adjacent oscillator. Current flowing through the entire device will result in excitation of carriers and optical gain. As the current density increases in magnitude in the oscillator, the optical gain will eventually equal the resonator losses, a condition termed threshold. Due to the nonplanar shape of the entire front facet 5, the threshold current density for oscillator 17, (where the front facet 33 and the rear facet 4 are parallel), will be much lower than the current density for the off-axis amplifiers, in which the front facets 31 and 31' are tilted or misaligned and thus in a nonparallel relationship with respect to the rear facet of the device by the aforesaid angle 32. This misalignment of the cavity mirrors or facets will result in poor feedback and high threshold current densities. Therefore, the oscillator 17 will lase at much lower current densities than the off-axis amplifiers. During operation, high current densities, several times higher than the threshold current densities of the oscillator, will be driven through the off-axis amplifiers in a continuous manner. Although these currents and the resulting gain in the off-axis amplifiers will be high, the even higher threshold current densities will not allow the off-axis amplifiers to lase.

In order to obtain useful output from the device, the oscillator must be turned on by supplying a current larger than the threshold current. Once the oscillator current exceeds the threshold current, the oscillator will lase in the manner of a typical Fabry-Perot laser. The lasing mode will diffractively spread out from the central oscillator 17 into the flanking off-axis amplifiers. As the lasing mode from the oscillator is optically coupled into the off-axis amplifiers, the power in the lasing mode will be amplified and output light beams will be produced at both the front and rear facets.

To produce output light that is modulated at high frequencies, current supplied to the oscillator can be modulated by current control device 41, while current fed to the amplifiers will flow through electrodes 15 and 15' continuously. When current is delivered to the oscillator, laser action will occur above threshold as in a typical Fabry-Perot resonator. When the current to the oscillator is cut off, for example by opening switch 43, the oscillator will shut off to return the device to the original condition in which current is flowing through the amplifiers, but the output light beam power is negligible. Therefore, laser action in the device is controlled through the modulation of current to the high-speed oscillator 17.

The aforesaid slight mirror facet misalignment results in an inefficient resonator having high losses which in turn results in high gain approaching threshold. This is because the misalignment changes the optical path lengths across the facet faces to prevent the reflected wavefronts from remaining in phase to meet the resonance condition. However, the continuous current flowing through the amplifiers is controlled and limited by current source 37 so that amplifier threshold is never reached and the amplifiers never lase. The following equation is of interest:

$$G_{Th} = a_i + \frac{1}{2L} LN\left(\frac{1}{R_1 R_2}\right) \quad (1)$$

where $G_{th}$=gain; resonator losses=internal loss $a_i$ plus mirror losses due to reflectivities R being less than one. In the gain v. injected current function shown in FIG. 3, as the injected current increases, the gain will increase. However, if the gain is less than the resonator losses, the oscillation condition will not be met until the gain equals the resonator losses. When this occurs, the oscillation condition is satisfied and lasing occurs. The amount of gain required to meet the oscillation condition is known as the threshold gain.

Figure 3:
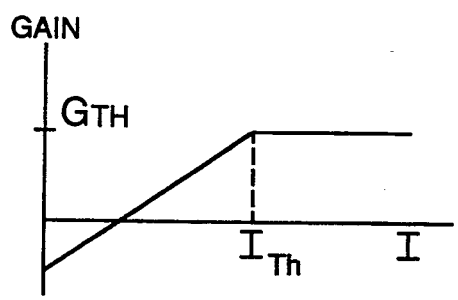
FIG. 3 illustrates a plot useful in explaining the operation of the device.

Considering the plot of gain v. injected current, and equation (1), it may be appreciated that the aforesaid non-parallelism of the front and rear facet portions of the power amplifiers allows operation of the power amplifiers in a high gain condition. Since the effective reflectivity of the nonparallel tilted amplifier mirror facets are low, the threshold gain will be high in accordance with equation (1). As indicated in FIG. 3, the gain will continue to climb until threshold. However, because the threshold gain for the amplifiers is so high, the oscillation condition will never be met. Therefore, the gain available in the amplifiers will be directly related to the injected pump current, which is large. Thus the low mirror reflectivity of the amplifiers results in high resonator losses, which results in high threshold gain, to in turn result in high gain during amplifier operation. Typically, the electrical parameters are controlled to produce current densities of 200–400 amps per square cm through the oscillator and typically 1000–2000 amps per square cm through the amplifiers, although they will not lase at these current densities. Typically the device would have the following dimensions: length 500 microns, oscillator width is 3–4 microns, power amplifier width is 100–200 microns, total height is 100 microns of which the substrate is 95 microns in height and the epitaxial layers are on the order of 3–5 microns thick. The voltages applied across the device would be about two volts.

A variety of etching procedures that will produce optical quality facets can be employed such as Reactive Ion Etching, Chemically Assisted Ion Beam Etching, Reactive Ion Beam Etching, Ion Beam Etching and Ion Milling. Combinations of physical/chemical etch techniques may be utilized. In addition, Focused Ion Beam Milling can be used to mill optical quality facets of arbitrary feature.

Since numerous variations in the aforesaid embodiments of the invention will be apparent to the skilled workers in the art, the scope of the invention is to be limited solely by the terms of the following claims and art recognized equivalents thereof. For example, single-sided devices can be fabricated by patterning the metal with a break of several microns between the oscillator and the amplifier pads and bonding pads placed on the appropriate side. Double-sided devices can also be fabricated if output is taken from the etched/milled facet or multi-layered metal schemes can be employed. While the mirror facet misalignment is the presently preferred means for changing the optical path lengths across the facet faces to induce resonator loss, it may be feasible to change the index of refraction across the amplifier widths, rather than employing facet misalignment, to change the effective optical path lengths.

The design of the master oscillator can depend on the application required. Strongly index guided master oscillator sources will probably not be appropriate. However, a number of designs that provide both lateral and longitudinal mode control are more appropriate including Distributed Bragg Reflector designs, Distributed Feedback designs or other designs that provide longitudinal mode control and relatively low threshold. Various epitaxial structures producing a variety of wavelengths can be employed as workers in the art will appreciate. The dimensions and the facet tilt angle will vary depending on the epitaxial structure selected. Gratings can be employed for longitudinal mode control in the oscillator regions or output coupling from the amplifier region. Arrays of these devices could also be used for special applications requiring a variety of wavelengths or output apertures.

Various other embodiments of the invention can include strained or unstrained multiple quantum well layers for the active region. The concaved front facet could use cylindrical, aspherical, spherical or other curves for the roughly concaved but angled front facet. Oscillator designs can include lateral index profiles to guide the optical mode, and inter- or intra-cavity etalons for longitudinal mode control. Coated back or front facets may be used to change facet reflectivity values and outcoupling efficiencies.

What is claimed is:

1. Light beam generator comprising:
   (a) a semiconductor master oscillator extending along an oscillator axis;
   (b) a broad area semiconductor power amplifier means optically coupled to said master oscillator but positioned off-axis with respect to said oscillator axis, the area of said power amplifier means being substantially greater than the area of said master oscillator;
   (c) a first current source for causing said master oscillator to lase;
   (d) a second current source for injecting current into said broad area power amplifier means having a substantially higher current density than the current density supplied by said first current source but not being great enough to cause said power amplifier means to lase;
   (e) and wherein said light beam generator has a first mirror facet transverse with respect to said oscillator axis and a second mirror facet, opposite said first mirror facet, and wherein at least one portion of said second mirror facet has a non-parallel orientation with respect to said first mirror facet for inducing substantial resonator losses in said power amplifier.

2. The generator of claim 1 wherein said second mirror facet has a concave shape.

3. The generator of claim 1 wherein said power amplifier means comprises a pair of off-axis power amplifiers straddling said master oscillator.

4. The generator of claim 2 wherein said power amplifier means comprises a pair of off-axis power amplifiers straddling said master oscillator.

5. The generator of claim 3 wherein said second mirror facet comprises a first centrally positioned flat portion parallel with respect to said first mirror facet and a pair of tilted off-axis second mirror facet portions extending from said centrally positioned flat facet portion and which are slightly nonparallel with respect to said first mirror facet.

6. The generator of claim 4 wherein said second mirror facet comprises a first centrally positioned flat portion parallel with respect to said first mirror facet and a pair of tilted off-axis second mirror facet portions extending from said centrally positioned flat facet portion and which are slightly nonparallel with respect to said first mirror facet.

7. The generator of claim 5 wherein said pair of tilted off-axis second mirror facet portions form an angle of between one and three degrees with respect to said first centrally positioned flat portion of said second mirror facet.

8. The generator of claim 6 wherein said pair of tilted off-axis second mirror facet portions form an angle of between one and three degrees with respect to said first centrally positioned flat portion of said second mirror facet.

9. The generator of claim 1 wherein said master oscillator comprises a laser diode.

10. The generator of claim 3 wherein said master oscillator comprises a laser diode.

11. The generator of claim 7 wherein said master oscillator comprises a laser diode.

12. Light beam generator comprising:
    (a) a semiconductor master oscillator extending along an oscillator axis;
    (b) a broad area semiconductor power amplifier means formed alongside said semiconductor master oscillator and adjacent thereto for receiving and amplifying light produced by said master oscillator, the area of said power amplifier means being substantially greater than the area of said master oscillator;
    (c) a first current source for causing said master oscillator to lase;
    (d) a second current source for injecting current into said broad area power amplifier means having a substantially higher current density than the current density supplied by said first current source but not being great enough to cause said power amplifier means to lase;
    (e) and wherein said light beam generator has a first mirror facet transverse with respect to said oscillator axis and a second mirror facet, opposite said first mirror facet, and wherein at least one portion of said second mirror facet has a non-parallel orientation with respect to said first mirror facet for inducing substantial resonator losses in said power amplifier.

13. The generator of claim 12 wherein said second mirror facet has a concave shape.

14. The generator of claim 12 wherein said power amplifier means comprises a pair of off-axis power amplifiers straddling said master oscillator.

15. The generator of claim 13 wherein said power amplifier means comprises a pair of off-axis power amplifiers straddling said master oscillator.

16. The generator of claim 14 wherein said second mirror facet comprises a first centrally positioned flat portion parallel with respect to said first mirror facet and a pair of tilted off-axis second mirror facet portions extending from said centrally positioned flat facet portion and which are slightly nonparallel with respect to said first mirror facet.

17. The generator of claim 15 wherein said second mirror facet comprises a first centrally positioned flat portion parallel with respect to said first mirror facet and a pair of tilted off-axis second mirror facet portions extending from said centrally positioned flat facet portion and which are slightly nonparallel with respect to said first mirror facet.

18. The generator of claim 16 wherein said pair of tilted off-axis second mirror facet portions form an angle of between one and three degrees with respect to said first centrally positioned flat portion of said second mirror facet.

19. The generator of claim 17 wherein said pair of tilted off-axis second mirror facet portions form an angle of between one and three degrees with respect to said first centrally positioned flat portion of said second mirror facet.

20. The generator of claim 12 wherein said master oscillator comprises a laser diode.

21. The generator of claim 14 wherein said master oscillator comprises a laser diode.

22. The generator of claim 18 wherein said master oscillator comprises a laser diode.

23. Light beam generator comprising:
(a) a semiconductor master oscillator extending along an oscillator axis;
(b) a broad area semiconductor power amplifier means formed alongside said semiconductor master oscillator and adjacent thereto for amplifying light produced by said master oscillator, the area of said power amplifier means being substantially greater than the area of said master oscillator;
(c) a first current source for causing said master oscillator to lase;
(d) a second current source for injecting current into said broad area power amplifier means having a substantially higher current density than the current density supplied by said first current source but not being great enough to cause said power amplifier means to lase;
(e) and wherein said light beam generator includes means for inducing substantial resonator losses in said power amplifier means.

24. The generator of claim 23 wherein said means for inducing substantial resonator losses includes means for changing the optical path lengths within the power amplifier means.

25. The generator of claim 24 wherein said power amplifier means comprises a pair of off-axis power amplifiers straddling said master oscillator.

26. The generator of claim 25 wherein said master oscillator comprises a laser diode.

* * * * *